(12) United States Patent
Park

(10) Patent No.: US 9,030,386 B2
(45) Date of Patent: May 12, 2015

(54) SOUND PENETRATING DISPLAY APPARATUS FOR OUTPUTTING THE SOUNDS HAVING OBJECT LOCATION EFFECT IN A SCENE

(75) Inventor: Seung-min Park, Seoul (KR)

(73) Assignee: The Korea Development Bank, Seoul (KR)

( * ) Notice: Subject to any disclaimer, the term of this patent is extended or adjusted under 35 U.S.C. 154(b) by 665 days.

(21) Appl. No.: 13/375,505

(22) PCT Filed: Jun. 1, 2010

(86) PCT No.: PCT/KR2010/003491
§ 371 (c)(1),
(2), (4) Date: Dec. 1, 2011

(87) PCT Pub. No.: WO2010/140811
PCT Pub. Date: Dec. 9, 2010

(65) Prior Publication Data
US 2012/0082332 A1    Apr. 5, 2012

(30) Foreign Application Priority Data

Jun. 2, 2009  (KR) .................. 10-2009-0048528

(51) Int. Cl.
*H04R 1/02*      (2006.01)
*H04N 5/60*      (2006.01)
*H04N 5/64*      (2006.01)
*H01L 27/32*     (2006.01)

(52) U.S. Cl.
CPC .............. *H04N 5/60* (2013.01); *H01L 27/3211* (2013.01); *H04N 5/642* (2013.01); *H04R 1/028* (2013.01); *H04R 2499/15* (2013.01)

(58) Field of Classification Search
USPC .................. 345/76; 381/111, 152, 333, 388
See application file for complete search history.

(56) References Cited

U.S. PATENT DOCUMENTS

| 7,565,949 | B2 | 7/2009 | Tojo | |
| 2006/0066508 | A1* | 3/2006 | Walck et al. | 345/7 |
| 2007/0071259 | A1 | 3/2007 | Tojo | |
| 2012/0243719 | A1* | 9/2012 | Franklin et al. | 381/333 |

FOREIGN PATENT DOCUMENTS

| EP | 2773130 A1 * | 9/2014 |
| JP | 2001-133888 | 5/2001 |
| JP | 2005-117267 | 4/2005 |
| JP | 2007-129511 | 5/2007 |
| KR | 10-2008-0037739 | 4/2008 |
| WO | WO 2008093721 A1 * | 8/2008 |

* cited by examiner

OTHER PUBLICATIONS

International Search Report issued in International Application No. PCT/KR2010/003491 dated Jul. 7, 2010 with English translation (5 pages).

*Primary Examiner* — Amare Mengistu
*Assistant Examiner* — Stacy Khoo
(74) *Attorney, Agent, or Firm* — Flynn, Thiel, Boutell & Tanis, P.C.

(57) ABSTRACT

A sound penetrating display apparatus for outputting sound having an object-based position coordinate effect is disclosed, which apparatus comprises a plurality of pixels, a plurality of holes which are distributed in an OLED (Organic Light Emitting Diode) display panel in a certain dense in order for sound from a speaker disposed at a back side of the OLED display panel to penetrate, a driving circuit for driving the OLED display panel, a protecting layer which is attached to a back side of the OLED display panel or is disposed close to the same and is formed of holes matching with the holes of the panel, and a plurality of matrix speakers which are disposed at a back side of the OLED display panel.

3 Claims, 7 Drawing Sheets

SOUND PENETRATING DISPLAY APPARATUS FOR OUTPUTTING THE SOUNDS HAVING OBJECT LOCATION EFFECT IN A SCENE

TECHNICAL FIELD

The present invention relates to a sound penetrating display apparatus, and in particular to a sound penetrating display apparatus for outputting the sounds having object location effect in a scene.

BACKGROUND ART

In recent years, as life standard advances, a lot of people tend to enjoy television programs and movies with a home theater system. The common display apparatus of a television or a home theater system changes from a conventional CRT to a LCD and a PDP, and a new display apparatus such as an OLED (Organic Light Emitting Diodes) is under development, with the size of a display screen increasing.

As shown in FIG. 1, in order to develop a common home theater system, there are needed front left and right speakers, a subwoofer, surround back speakers, surround left and right speakers and a center speaker. Among the above speakers, the center speaker is positioned at the center between the front left and right speakers, thus enhancing the propagation of sound, which leads to output a relatively perfect sound image. The center speaker is generally installed at a lower side of a display panel, thus outputting dialogue; however a display panel is made bigger and bigger, the dimension of the screen increases. At this time, even when the positions of an object displayed on the screen are located at the left side or the right side, since the sound is outputted from the center speaker, namely, from the central portion, the portions where sounds are outputted and the positions of the objects of the screen do not match, so it is impossible to hear unmatched sounds.

In order to overcome the above problems, the patent application number 10-2008-2526 of the applicant same as that of the present application (entitled "Display apparatus having object-based 3D sound coordinate indications") is directed to a display apparatus having matrix speakers, thus generating 3D sounds from the back of the display panel.

DISCLOSURE OF INVENTION

Accordingly, it is an object of the present invention to provide a method of forming a sound pass hole at a display panel, thus letting sounds with a position coordinate effect from a matrix speaker to penetrate in the forward direction through the display panel wherein the matrix speaker is disposed at a backside of the display panel, and to provide a sound penetrating display panel, and a display apparatus.

To achieve the above objects, a sound penetrating display panel for outputting sounds having an object-based position coordinate effect comprises a panel with a plurality of pixels, with the panel consisting of a plurality of holes formed at the whole portions of the panel to help sound penetrate. The pane might be formed of an OLED panel in which holes can be easily formed. The size of each hole formed at the panel is similar with the size of each pixel.

The display apparatus for an object-based sound output according to an embodiment of the present invention comprises a speaker system formed of a plurality of holes for the penetration of pixels and sound, a sound penetration display panel with a driving circuit, a protecting layer for absorbing the sound emitted through the portions except through the holes of the display panel, and a plurality of speakers which are attached to the back side of the sound penetrating display panel or disposed closer thereto and are arranged in 2-dimension.

Advantageous Effects

The sound penetrating apparatus according to the present invention is equipped with sound penetrating holes between the pixels of the display panel, thus letting the sounds from the matrix speakers disposed at the back side of the display panel to penetrate, so it is possible to hear the sounds from a corresponding speaker depending on the position of an object of a screen, thus allowing a user to hear the sounds with a 3D effects having a sound coordinate effect depending on the positions of the objects of a screen.

BRIEF DESCRIPTION OF THE DRAWINGS

The present invention will become better understood with reference to the accompanying drawings which are given only by way of illustration and thus are not limitative of the present invention, wherein.

MODES FOR CARRYING OUT THE INVENTION

The preferred embodiments of the present invention will be described with reference to the accompanying drawings.

Figure 1:
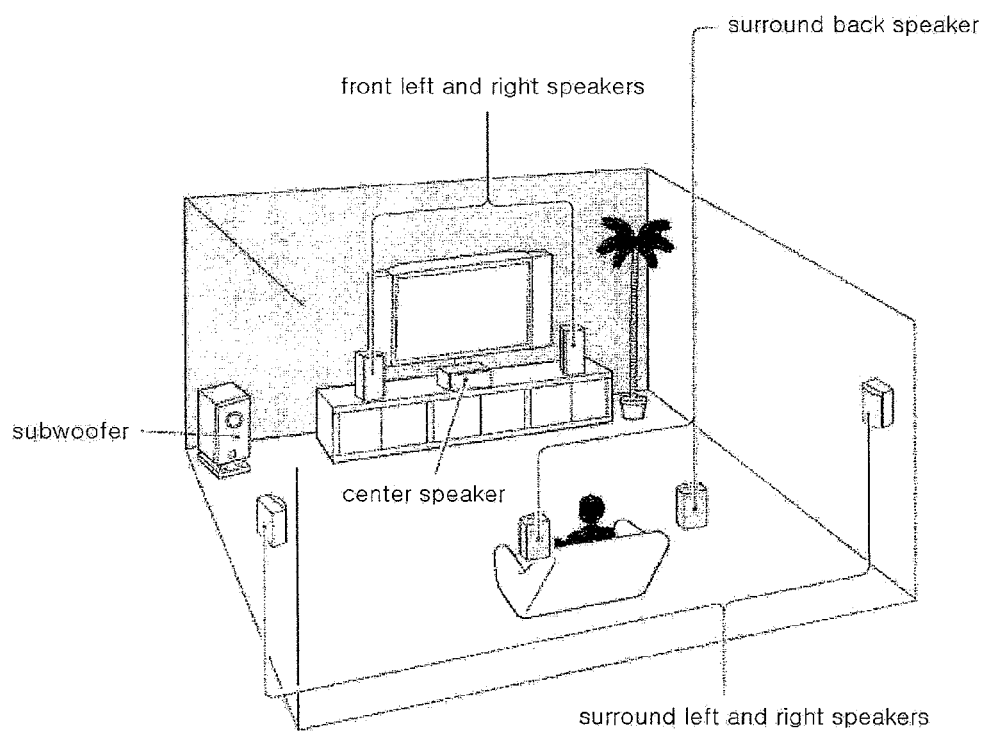
FIG. 1 is a view illustrating a construction of a conventional home theater.
Figure 2:
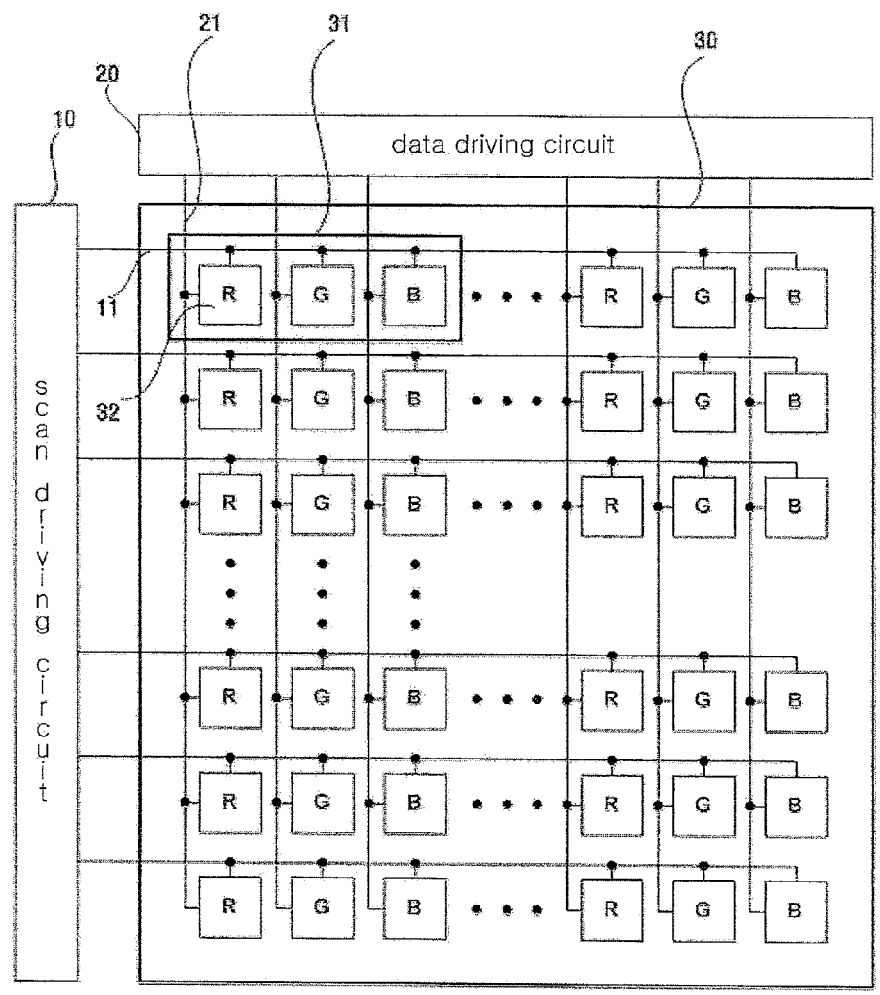
FIG. 2 is a view illustrating a conventional OLED display apparatus.
Figure 3:
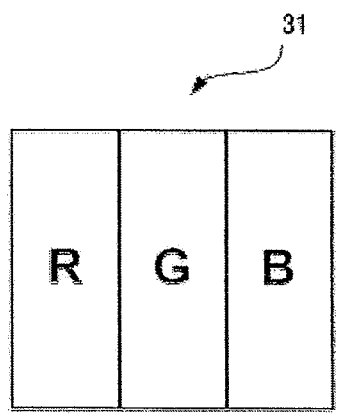
FIG. 3 is a view illustrating a construction of a pixel of FIG. 2.
Figure 4:
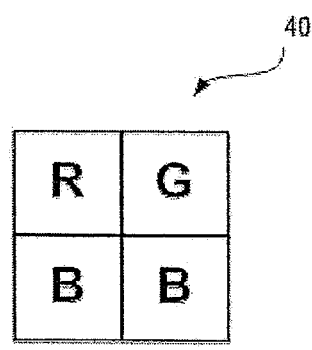
FIG. 4 is a view illustrating a different construction of a pixel.

FIG. 2 is a view illustrating a conventional OLED display apparatus.

The OLED display apparatus comprises a panel 30 formed of a plurality of pixels, and driving circuits 10 and 20 for driving the panel 30. The pixel 31 of the panel 30 is formed of sub-pixels 32 of three colors R, G and B. The driving circuits 10 and 20 comprise a scan driving circuit 10 and a data driving circuit 20. Each pixel 31 is connected with a scan line 11 and a data line 21. The data riving circuit 20 applies a data signal to each pixel 31 through the data line 21, and the scan driving circuit 10 applies a scan signal to the pixel 31 through the scan line 11.

As shown in FIG. 2, the pixel 31 is formed of R, G and B sub-pixels having the same sizes. Since the light emission efficiencies and life spans of the R, G and B sub-pixels generally have differences, so the pixels might be constituted with difference surface area ratios between sub-pixels.

Figure 5:
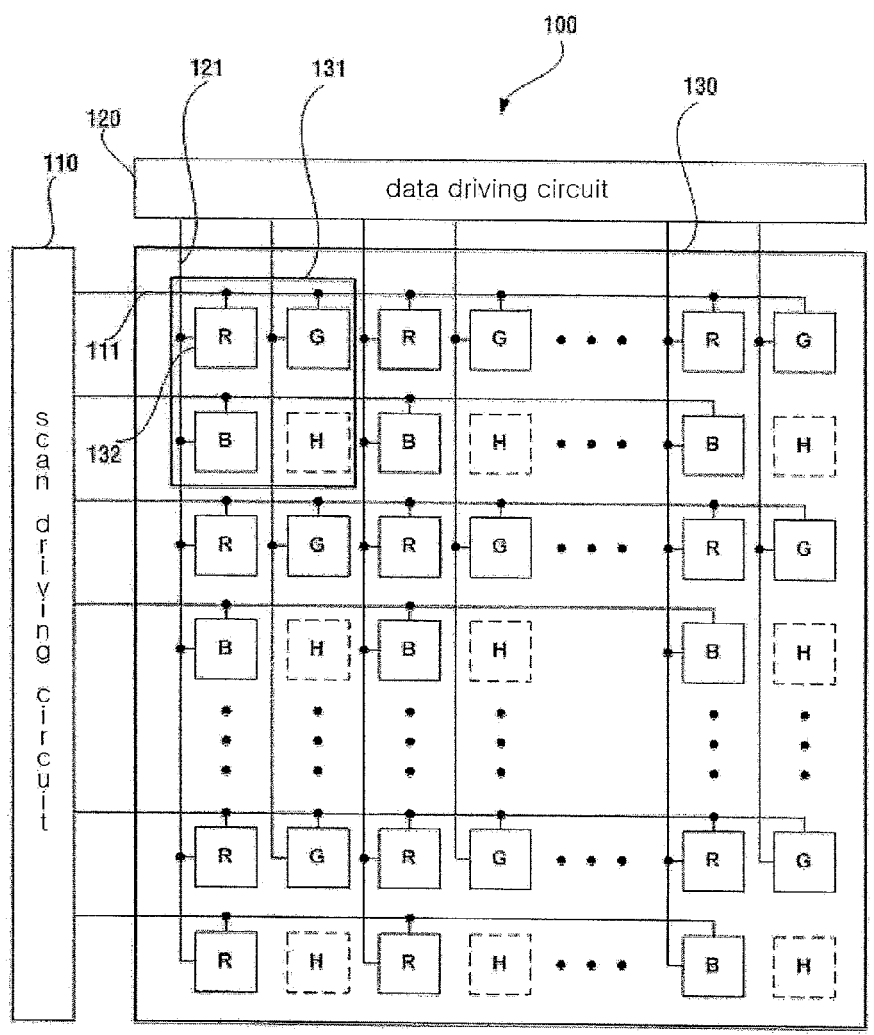
FIG. 5 is a view illustrating a construction of a sound penetrating display panel according to an embodiment of the present invention.

FIG. 5 is a view illustrating a construction of a sound penetrating display panel according to an embodiment of the present invention. Like the conventional display apparatus, the sound penetrating display panel 100 comprises a panel 130, and driving circuits 110 and 120 for driving the panel 130. The panel 130 is formed of a plurality of pixels 131, each pixel being formed of sub-pixels 132 of three colors for generating colors. Unlike the conventional display apparatus, the panel 130 according to the present invention comprises holes H for penetrating sound. As shown in FIG. 5, there is provided a sound penetrating display panel 100 in the panel 130 in uniform dense in a 2D structure. It is preferred that the size of each hole H of the panel 130 is smaller than the size of the pixel, and the hole H generally has the size of the sub-pixel.

Figure 6:
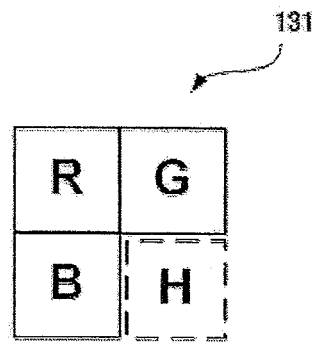
FIG. 6 is a view illustrating an example of a construction of a pixel according to an embodiment of the present invention.
Figure 7:
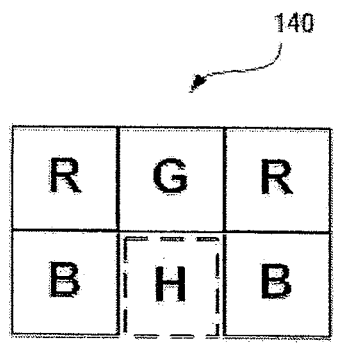
FIG. 7 is a view illustrating a construction of a pixel according to another embodiment of the present invention.
Figure 8:
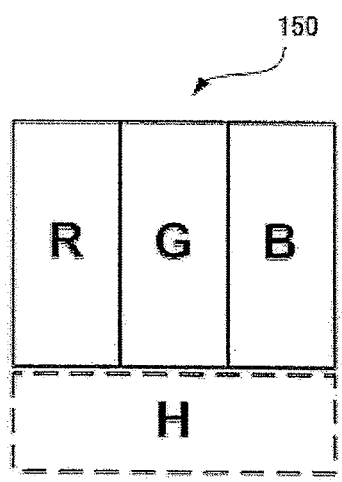
FIG. 8 is a view illustrating a construction of a pixel according to further another embodiment of the present invention.

The sound penetrating display panel according to the present invention is constructed in such a way that one hole is assigned to each pixel. As shown in FIGS. 6 through 8, the holes might be formed in various shapes. As shown in FIG. 6, the pixel 131 has square-shaped R, G and B sub-pixels, and square-shaped holes H. The sizes of the R, G and B sub-pixels and the holes H are same.

As shown in FIG. 7, the pixel 140 is formed of two square-shaped R sub-pixels, and one square-shaped G sub-pixel, and two square-shaped B sub-pixels and holes H. The sizes of the R, G and B sub-pixels and the holes H are same. As shown in FIG. 8, the pixels 150 have rectangular shaped R, G and B sub-pixels, and holes, and the sizes of the R, G and B sub-pixels are same. The sizes of the holes H might be different from the sizes of the R, G and B sub-pixels.

The constructions of the pixels of FIGS. 6 through 8 are provided for illustrative purposes, and the pixels might be implemented in various shapes.

As shown in FIG. 5, the driving circuits 110 and 120 comprise a scan driving circuit 110 and a data driving circuit 120 like the conventional display apparatus. Each pixel 131 is connected with the scan line 111 and the data line 121. The data driving circuit 120 applies a data signal to each pixel through the data line 121, and the scan diving circuit 110 applies a scan signal to the pixel 131 though the scan line 111.

The sound penetrating display panel 100 having the above holes might be implemented in various display methods; however it is most preferred that the sound penetrating display panel is implemented in the OLED method. In the future, various advanced methods might be utilized as technology advances.

Figure 9:
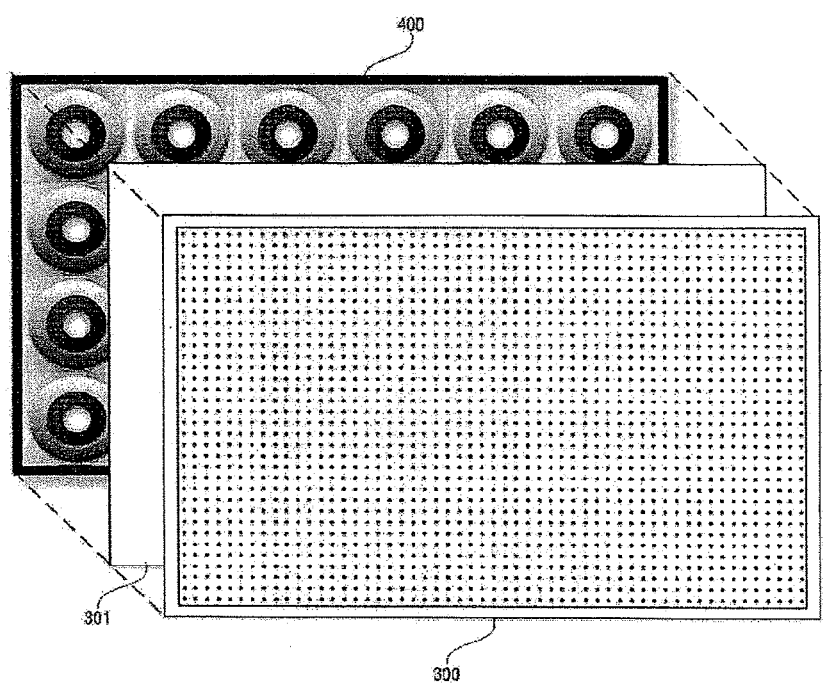
FIG. 9 is a schematic view illustrating a construction of a display apparatus for outputting an object-based sound according to an embodiment of the present invention.

FIG. 9 is a schematic view illustrating a sound penetrating display apparatus for outputting an object-based position coordinate effect according to an embodiment of the present invention.

The display apparatus according to the present invention comprises a sound penetrating display panel 300 formed of a plurality of pixels, a plurality of holes for penetrating sound, and a driving circuit, and a speaker system 400 formed of a protecting layer engaged at a rear side of the display panel and a plurality of matrix speakers which are attached to a back side of the sound penetrating display panel or arranged in a 2D close to the sound penetrating display panel.

The protecting layer 301 serves to protect the panel from vibrations generating when the speaker 401 outputs sound. The protecting layer 301 is is attached to a back side of the panel or is disposed close to the same and is equipped with the holes matching with the holes of the panel.

The protecting layer 301 comprises a sound absorption layer for protecting the panel. In other words, the sound outputted in the direction of the holes of the panel among the sound generated from the speaker system 400 is outputted in the direction of the front side of the sound penetrating display panel 300 through the holes of the protecting layer and the holes of the panel; however the sound outputted in the direction except for the holes of the panel is absorbed by the sound absorption layer contained in the panel of the protecting layer 301 before the sound reaches the panel. The protecting layer 301 might further comprise a reflection layer for enhancing a sound absorption efficiency in addition to the sound absorption layer. At this time, the sound absorption layer faces in the direction of the panel, and the reflection layer faces in the opposite direction of the panel (speaker system). The sound outputted in the direction of the holes of the panel among the sound generated from the speaker system 400 passes through the sound penetrating display panel 300 via the holes of the protecting layer and the holes of the panel. The sound outputted in the direction except for the holes of the panel is reflected toward the speaker system 400 by means of the reflection layer, and the reflected sound collides with the speaker system 400 and outputs toward the protecting layer 301. Part of the sound headed to the protecting layer 301 is outputted toward the front side of the sound penetrating display panel 300 via the holes of the protecting layer 301 and the holes of the panel. The sound absorption layer absorbs the vibrations so that the vibrations occurring when the sound is reflected by the reflecting layer are not transferred to the panel side.

Like the embodiment of FIG. 9, the speaker system 400 is attached to a back side of the sound penetrating display panel 300 or is disposed close to the same. Since the protecting layer 301 is positioned at the backward most portion of the sound penetrating display panel 300, the sound from the speaker system 400 passes through the protecting layer 301.

Like the embodiment of the present invention of FIG. 9, the sound of the speaker system passes through the small holes, and the final sound that a user listens to might be distorted as compared to original sounds. It is possible for a user to listen to sound similar with the original sound in such a way to distort the distortions of the sounds in advance.

Figure 10:
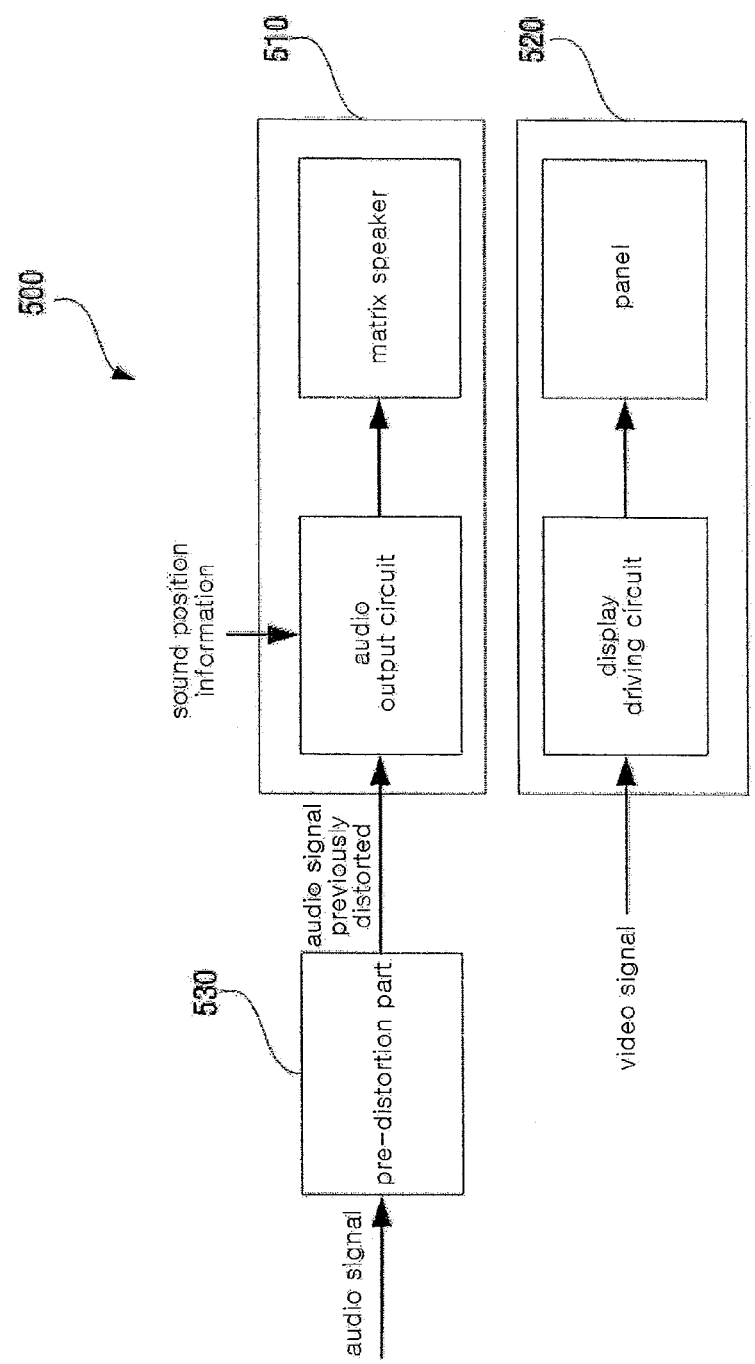
FIG. 10 is a block diagram illustrating a functional construction of a display apparatus according to an embodiment of the present invention.

As shown in FIG. 10, the display apparatus 500 for outputting an object-based sound comprises a panel formed of a plurality of pixel and a plurality of holes for the penetration of sound, a sound penetrating display panel 520 formed of a driving circuit for receiving a video signal and driving the panel, and a speaker system 510 formed of a plurality of speakers, and a pre-distortion part 530.

The speaker system 510 comprises a plurality of speakers which are attached to a back side of the sound penetrating display panel 520 or are disposed close to the same and are arranged in a 2D structure (arranged in a matrix shape), and an audio output circuit corresponds to one or a plurality of speakers determined depending on the position information of the sound, thus outputting audio signals.

The pre-distortion part 530 serves to previously distort the audio signal and provide to the audio output circuit in an attempt to prevent the sound outputted from the speakers from being distorted while the sound passes through the sound penetrating display panel 520.

The sound distortion phenomenon when the sound passes through the sound penetrating display panel 52 might change depending on the sizes of the holes of the panel and the density and arrangement. The sound before and after the distortion might be modeled as in the formula 1.

$$S2(s) = H(s) \times S1(s) \quad \text{[Formula 1]}$$

In the formula 1, S1(s) means the sound before distortion, and S2(s) means the sound after distortion, and H(s) means transfer function.

When it is assumed that the audio signal first inputted into the pre-input part is S0(s), and the transfer function of the pre-distorter 530 is H'(s), S1(s) might be expressed in the following formula 2.

$$S1(s)=H'(s) \times S0(s) \quad \text{[Formula 2]}$$

The formula 1 and the formula 2 might be rearranged, thus defining the sound S2(s), which has passed through the panel, in the following formula 3.

$$S2(s)=H(s) \times H'(s) \times S0(s) \quad \text{[Formula 3]}$$

In other words, when the transfer function H'(s) of the pre-distortion part 530 is designed to be closest to 1/H(s), it is possible to minimize the distortion of the sound generated while passing through the sound penetrating display panel 520.

The above-described embodiments of the present invention are provided for illustrative purposes, and it is obvious that the technical range of the present invention should be interpreted by means of the following accompanying claims.

The invention claimed is:

1. A sound penetrating display apparatus for displaying images, comprising:
    a plurality of pixels;
    a plurality of holes which are distributed in a display panel in a certain density in order for sound from a speaker disposed at a back side of the display panel to penetrate;
    a driving circuit for driving the display panel;
    a protecting layer which is disposed close to a back side of the display panel and is formed of holes matching with the holes of the panel; and
    a plurality of matrix speakers which are disposed at a back side of the display panel;
    wherein the protecting layer comprises a reflection layer for reflecting the sound which does not correspond to the holes of the panel and an absorption layer for absorbing vibrations caused by the sound which is reflected by the reflection layer.

2. The apparatus of claim 1, wherein the sizes of the holes of the display apparatus are the same as the sizes of sub-pixels of the display panel.

3. A sound penetrating display panel for displaying images, comprising:
    a plurality of pixels;
    a plurality of holes which are distributed in a display panel in a certain density in order for sound from a speaker disposed at a back side of the display panel to penetrate;
    a driving circuit for driving the display panel;
    a protecting layer which is disposed close to a back side of the display panel and is formed of holes matching with the holes of the panel; and
    a plurality of matrix speakers which are disposed at a back side of the display panel;
    wherein the protecting layer comprises a reflection layer for reflecting the sound which does not correspond to the holes of the panel and an absorption layer for absorbing vibrations caused by the sound which is reflected by the reflection layer.

* * * * *